US009064639B2

(12) United States Patent
Han et al.

(10) Patent No.: US 9,064,639 B2
(45) Date of Patent: Jun. 23, 2015

(54) MULTILAYER CERAMIC ELECTRONIC COMPONENT AND BOARD FOR MOUNTING THE SAME

(71) Applicant: Samsung Electro-Mechanics Co., Ltd., Suwon, Gyunggi-do (KR)

(72) Inventors: Byung Woo Han, Gyunggi-do (KR); Dae Bok Oh, Gyunggi-do (KR); Jae Yeol Choi, Gyunggi-do (KR); Sang Huk Kim, Gyunggi-do (KR)

(73) Assignee: SAMSUNG ELECTRO-MECHANICS CO., LTD., Suwon, Gyunggi-do (KR)

( * ) Notice: Subject to any disclaimer, the term of this patent is extended or adjusted under 35 U.S.C. 154(b) by 154 days.

(21) Appl. No.: 13/952,573

(22) Filed: Jul. 26, 2013

(65) Prior Publication Data

US 2014/0318842 A1  Oct. 30, 2014

(30) Foreign Application Priority Data

Apr. 26, 2013 (KR) .................. 10-2013-0046769

(51) Int. Cl.
| | |
|---|---|
| *H01G 4/12* | (2006.01) |
| *H01G 4/30* | (2006.01) |
| *H01G 2/06* | (2006.01) |
| *H05K 1/18* | (2006.01) |

(52) U.S. Cl.
CPC ............... *H01G 4/30* (2013.01); *H01G 2/065* (2013.01); *H05K 1/181* (2013.01)

(58) Field of Classification Search
USPC ............... 361/301.1, 301.4, 303–305, 306.1, 361/306.3, 311–313, 321.1, 321.2
See application file for complete search history.

(56) References Cited

U.S. PATENT DOCUMENTS

| 6,104,599 A * | 8/2000 | Ahiko et al. ............... 361/306.3 |
| 6,715,197 B2 * | 4/2004 | Okuyama et al. ............ 29/592.1 |

(Continued)

FOREIGN PATENT DOCUMENTS

| JP | 5-74644 B2 | 3/1993 |
| JP | 09-260184 A | 3/1997 |

(Continued)

OTHER PUBLICATIONS

Japanese Office Action issued in Japanese Application No. 2013-154306 dated Apr. 8, 2014, w/English translation.

(Continued)

*Primary Examiner* — Nguyen T Ha
(74) *Attorney, Agent, or Firm* — McDermott Will & Emery LLP

(57) ABSTRACT

There is provided a multilayer ceramic electronic component includes: a ceramic body including dielectric layers stacked therein and satisfying T(thickness)/W(width)>1.0; first and second internal electrodes disposed to face each other in the ceramic body, having the dielectric layer disposed therebetween, and alternately exposed through end surfaces of the ceramic body; and first and second external electrodes extended from the end surfaces of the ceramic body to upper and lower main surfaces of the ceramic body wherein, when a height of the ceramic body is defined as a, and a distance from an upper end of the first or second external electrode formed on the upper main surface of the ceramic body to a lower end of the first or second external electrode formed on the lower main surface of the ceramic body is defined as b, 0.990≤a/b<1 is satisfied.

11 Claims, 5 Drawing Sheets

(56) References Cited

U.S. PATENT DOCUMENTS

| | | | |
|---|---|---|---|
| 8,310,805 B2 * | 11/2012 | Tashima et al. | 361/303 |
| 8,385,048 B2 * | 2/2013 | Ahn et al. | 361/321.1 |
| 8,547,682 B2 * | 10/2013 | Sasabayashi | 361/306.3 |
| 8,934,215 B2 * | 1/2015 | Cho et al. | 361/321.2 |
| 2005/0088803 A1 | 4/2005 | Umeda et al. | |
| 2005/0264975 A1 | 12/2005 | Yamazaki | |
| 2010/0118467 A1 | 5/2010 | Takeuchi et al. | |
| 2011/0149471 A1 | 6/2011 | Hur et al. | |
| 2012/0152604 A1 | 6/2012 | Ahn et al. | |
| 2012/0298407 A1 | 11/2012 | Ahn et al. | |
| 2012/0327556 A1 | 12/2012 | Ahn et al. | |
| 2013/0027839 A1 | 1/2013 | Kim | |
| 2013/0050894 A1 | 2/2013 | Ahn et al. | |
| 2013/0084118 A1 | 4/2013 | Hara | |

FOREIGN PATENT DOCUMENTS

| | | |
|---|---|---|
| JP | 2003-017358 A | 1/2003 |
| JP | 2003-282332 A | 3/2003 |
| JP | 2005-129802 A | 5/2005 |
| JP | 2007-158267 A | 6/2007 |
| JP | 2010-067721 A | 3/2010 |
| JP | 2010-118499 A | 5/2010 |
| JP | 2011-135082 A | 7/2011 |
| JP | 2012-4480 A | 1/2012 |
| JP | 2012-119616 A | 6/2012 |
| JP | 2012-216864 A | 11/2012 |
| JP | 2012-248846 A | 12/2012 |
| JP | 2013-008970 A | 1/2013 |
| JP | 2013-030754 A | 2/2013 |
| JP | 2013-46069 A | 3/2013 |
| KR | 10-2006-0049458 A | 5/2006 |

OTHER PUBLICATIONS

Korean Office Action issued in Korean Application 10-2013-0046769 dated Jun. 19, 2014, w/English translation.

* cited by examiner

MULTILAYER CERAMIC ELECTRONIC COMPONENT AND BOARD FOR MOUNTING THE SAME

CROSS-REFERENCE TO RELATED APPLICATIONS

This application claims the priority of Korean Patent Application No. 10-2013-0046769 filed on Apr. 26, 2013, in the Korean Intellectual Property Office, the disclosure of which is incorporated herein by reference.

BACKGROUND OF THE INVENTION

1. Field of the Invention

The present invention relates to a multilayer ceramic electronic component and a board for mounting the same.

2. Description of the Related Art

In accordance with the recent trend for miniaturization of electronic products, a multilayer ceramic electronic component used in electronic products has been required to be reduced in size and to have a high level of capacitance implemented therein.

Therefore, efforts to stack thin dielectric layers and internal electrodes in greater amounts have been attempted using various methods, and recently, a multilayer ceramic electronic component in which a thickness of the dielectric layer is reduced and the number of stacked dielectric layers is increased has been manufactured.

Accordingly, the multilayer ceramic electronic component is able to be miniaturized, due to the dielectric layers and the internal electrodes being thinned, allowing the number of stacked layers to be increased for the implementation of a high level of capacitance.

However, in the case in which the number of stacked layers is increased while the thicknesses of the dielectric layers and the internal electrodes are reduced as described above, the multilayer ceramic electronic component may achieve high capacitance, but a thickness of the resultant multilayer ceramic electronic component may be greater than a width thereof, due to an increase in the number of stacked layers.

In the case in which the thickness of the multilayer ceramic electronic component is greater than the width thereof as described above, since external electrodes formed on both end surfaces of the multilayer ceramic electronic component generally have a rounded circumferential surface.

Therefore, when the multilayer ceramic electronic component is mounted on a printed circuit board, or the like, the multilayer ceramic electronic component may not be maintained in a mounted state, but may topple over frequently, whereby a failure rate in mounting the multilayer ceramic electronic component has increased.

In addition, when the thicknesses of the dielectric layers and the internal electrodes are reduced, step portions may be generated due to the increased number of stacked layers, and thus, the reliability of the multilayer ceramic electronic component may be degraded. Particularly, short-circuits may frequently occur near a cover layer receiving a large amount of stress at the time of compressing a ceramic body, and thus, the reliability may be significantly degraded.

Patent Document 1 discloses a multilayer ceramic condenser reduced in size and having a high level of capacitance implemented therein. However, Patent Document 1 does not disclose solutions to the problem that the multilayer ceramic condenser may topple over when mounted on a printed circuit board.

RELATED ART DOCUMENT (Patent Document 1) Japanese Patent Laid-open Publication No. 2005-129802

SUMMARY OF THE INVENTION

An aspect of the present invention provides a multilayer ceramic electronic component capable of preventing degradation in reliability caused by a step, as well as solving a problem that a multilayer ceramic electronic component topples over at the time of being mounted on a printed circuit board, or the like, while realizing a high level of capacitance due to an increase in the number of stacked layers.

According to an aspect of the present invention, there is provided a multilayer ceramic electronic component including: a ceramic body including a plurality of dielectric layers stacked in a thickness direction and satisfying T/W>1.0 when a width thereof is defined as W and a thickness thereof is defined as T; a plurality of first and second internal electrodes disposed in the ceramic body so as to face each other, having the dielectric layer disposed therebetween, and alternately exposed through both end surfaces of the ceramic body; and first and second external electrodes extended from the end surfaces of the ceramic body to upper and lower main surfaces of the ceramic body, and electrically connected to the first and second internal electrodes, respectively, wherein, when a height of the ceramic body is defined as a, and a distance from an upper end of the first or second external electrode formed on the upper main surface of the ceramic body to a lower end of the first or second external electrode formed on the lower main surface of the ceramic body is defined as b, $0.990 \leq a/b < 1$ is satisfied.

According to another aspect of the present invention, there is provided a multilayer ceramic electronic component including: a ceramic body including a plurality of dielectric layers stacked in a width direction and satisfying T/W>1.0 when a width thereof is defined as W and a thickness thereof is defined as T; a plurality of first and second internal electrodes disposed in the ceramic body so as to face each other, having the dielectric layer disposed therebetween, and alternately exposed through both end surfaces of the ceramic body; and first and second external electrodes extended from the end surfaces of the ceramic body to upper and lower main surfaces of the ceramic body, and electrically connected to the first and second internal electrodes, respectively, wherein, when a height of the ceramic body is defined as a, and a distance from an upper end of the first or second external electrode formed on the upper main surface of the ceramic body to a lower end of the first or second external electrode formed on the lower main surface of the ceramic body is defined as b, $0.990 \leq a/b < 1$ is satisfied.

When an average thickness of the dielectric layers is defined as td, $0.1 \, \mu m \leq td \leq 0.6 \, \mu m$ may be satisfied.

The first and second internal electrodes may have a thickness of 0.6 μm or less.

When an average thickness of the dielectric layers is defined as td and an average thickness of the first and second internal electrodes is defined as te, $te/td \leq 0.833$ may be satisfied.

The dielectric layers may be stacked in an amount of 500 or more layers.

According to another aspect of the present invention, there is provided a board for mounting a multilayer ceramic electronic component, the board including: a printed circuit board having first and second electrode pads provided thereon; and the multilayer ceramic electronic component as described above disposed on the first and second electrode pads.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
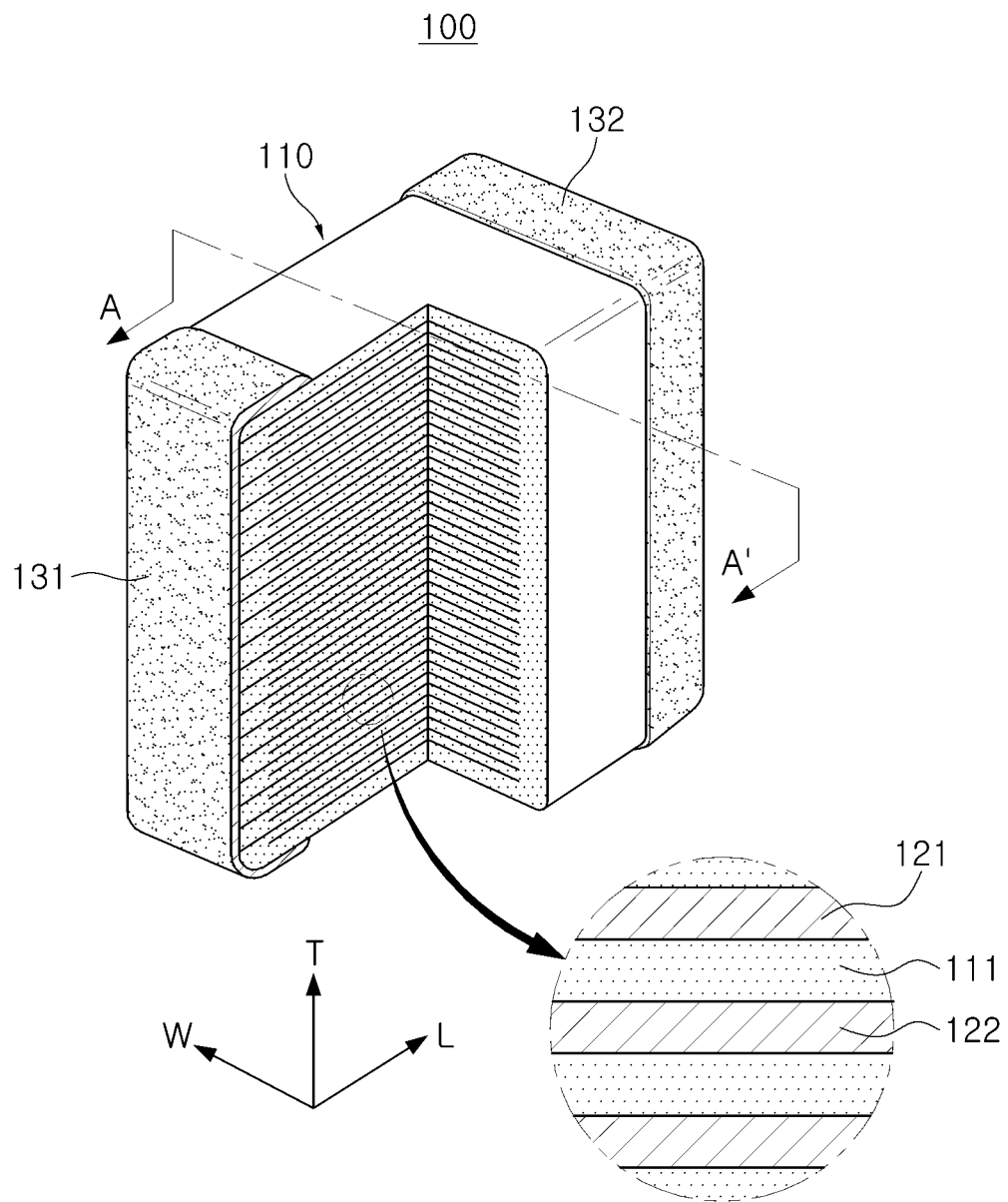
FIG. 1 is a partially cutaway perspective view of a multilayer ceramic capacitor according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Hereinafter, a multilayer ceramic electronic component according to an embodiment of the present invention will be described. Particularly, a multilayer ceramic capacitor will be described. However, the invention is not limited thereto.

Multilayer Ceramic Capacitor

FIG. 1 is a partially cutaway perspective view of a multilayer ceramic capacitor according to an embodiment of the present invention.

Referring to FIG. 1, a multilayer ceramic capacitor 100 according to an embodiment of the present invention includes a ceramic body 110, a plurality of first and second internal electrodes 121 and 122, and first and second external electrodes 131 and 132.

The ceramic body 110 is formed by stacking a plurality of dielectric layers 111 in a thickness direction, and sintering the stacked dielectric layers. Here, adjacent dielectric layers 111 may be integrated such that boundaries therebetween may not be readily apparent without the use of a scanning electron microscope (SEM).

A shape of the ceramic body 110 is not particularly limited, and for example, the ceramic body 110 may have a hexahedral shape.

When defining directions of the hexahedron forming the ceramic body 110 in order to clearly describe the embodiment of the invention, L, W and T shown in the drawings are a length direction, a width direction and a thickness direction, respectively.

In addition, for convenience of explanation, uppermost and lowermost surfaces of the ceramic body 110 opposing each other in a thickness direction refer to first and second main surfaces, end surfaces connecting the first and second main surfaces to each other and opposing each other in a length direction refer to first and second end surfaces, and side surfaces opposing each other in a width direction refer to first and second side surfaces.

The ceramic body 110 having a form in which the number of dielectric layers 111 is increased in order to implement a high degree of capacitance therein may satisfy T/W>1.0 when a width thereof is defined as W and a thickness thereof is defined as T, such that the ceramic body 110 has a thickness greater than a width thereof.

Here, the number of stacked dielectric layers 111 is not specifically limited. For example, 500 or more dielectric layers may be stacked in order to realize high capacitance while securing a sufficient space when being mounted on a board.

The dielectric layer 111 may include a ceramic material having a high degree of permittivity, for example, a $BaTiO_3$-based ceramic powder, or the like. However, the material of the dielectric layer is not limited thereto as far as sufficient capacitance may be obtained.

Furthermore, in addition to the ceramic powder, a transition metal oxide or carbide, a rare-earth element, various ceramic additives such as magnesium (Mg), aluminum (Al), and the like, an organic solvent, a plasticizer, a binder, a dispersant, or the like, may be added to the dielectric layer 111, if needed.

Then, in order to produce a multilayer ceramic capacitor having subminiature size and ultra high capacitance implemented therein, when an average thickness of the dielectric layer 111 is defined as td, $0.1\ \mu m \leq td \leq 0.6\ \mu m$ may be satisfied, but the invention is not limited thereto.

The average thickness td of the dielectric layer 111 may be measured by scanning a cross-section of the ceramic body 110 in a width direction with a Scanning Electron Microscope (SEM).

For example, the average thickness of the dielectric layer may be calculated by measuring thicknesses at thirty equidistant points in the width direction of any one of the dielectric layers extracted from an image obtained by scanning the cross-section of the ceramic body 110 in the width and thickness (W-T) direction, cut in a central portion of the ceramic body 110 in the length direction, using the SEM.

The thicknesses at thirty equidistant points may be measured in an active region, a region in which the first and second internal electrodes 121 and 122 are overlapped with each other.

Furthermore, when the average thickness measurement is performed with respect to 10 or more dielectric layers, it can be further generalized.

The first and second internal electrodes 121 and 122, having different polarities, may be disposed to face each other, having the ceramic sheet forming the dielectric layer 111 interposed therebetween, and may be exposed through the first and second end surfaces of the ceramic body 110, respectively.

Then, the first and second internal electrodes 121 and 122 may be electrically insulated from each other by the dielectric layer 111 disposed therebetween.

Further, the first and second internal electrodes 121 and 122 may be formed of a conductive metal. For example, any one of silver (Ag), palladium (Pd), platinum (Pt), nickel (Ni) and copper (Cu) or alloys thereof, or the like, may be used as the conductive metal. However, the invention is not limited thereto.

Furthermore, the average thickness of respective first and second internal electrodes 121 and 122 is not specifically limited, as long as the first and second internal electrodes may form capacitance. For example, the average thickness may be 0.6 μm or less. However, the invention is not limited thereto.

When the average thickness of the first and second internal electrodes 121 and 122 is greater than 0.6 μm and is excessively increased, cracks may occur in the ceramic body 110.

The average thickness of the first and second internal electrodes 121 and 122 may be determined by scanning the cross-section of the ceramic body 110 in the width direction using the SEM.

For example, the average thickness of the internal electrode may be calculated by measuring thicknesses at thirty equidistant points in the width direction of any one of the internal electrodes extracted from the image obtained by scanning the cross-section of the ceramic body 110 in the width and thickness (W-T) direction cut in the central portion of the ceramic body 110 in the length direction using the SEM.

The thicknesses at thirty equidistant points may be measured in an active region, a region in which the first and second internal electrodes 121 and 122 are overlapped with each other.

Furthermore, when the average thickness measurement is performed with respect to 10 or more internal electrodes, it can be further generalized.

In addition, when the average thickness of the dielectric layer 111 is defined as td and the thickness of the first and second internal electrodes 121 and 122 is defined as te, te/td≤0.833 may be satisfied. In a case in which te/td is excessively large, stress inside the multilayer ceramic capacitor 100 may be increased due to a sintering shrinkage difference between the dielectric layer 111 and the first and second internal electrodes 121 and 122. Therefore, the occurrence of cracks may increase in the multilayer ceramic capacitor 100.

Therefore, te/td may be in a range of te/td≤0.833 such that cracks inside the multilayer ceramic capacitor 100 may be effectively prevented and electrode connectivity of the first and second internal electrodes 121 and 122 may be improved to realize relatively large capacitance.

The first and second external electrodes 131 and 132 may be extended from the first and second end surfaces of the ceramic body 110 to the first and second main surfaces, and may be electrically connected to the plurality of the first and second internal electrodes 121 and 122 alternately exposed through the first and second end surfaces of the ceramic body 110. Here, the first and second external electrodes 131 and 132 may be extended from the first and second end surfaces of the ceramic body 110 to the first and second side surfaces of the ceramic body 110, in order to improve moisture resistance.

Further, the first and second external electrodes 131 and 132 may be formed of a conductive metal, for example, silver (Ag), nickel (Ni), copper (Cu), or the like. The first and second external electrodes 131 and 132 may be formed by applying a conductive paste to both end surfaces of the ceramic body 110, the conductive paste being prepared by adding a glass frit to the conductive metal powder, and performing a sintering process thereon, but the invention is not limited thereto.

Meanwhile, first and second plating layers (not shown) may be formed on the first and second external electrodes 131 and 132, if necessary.

When the multilayer ceramic capacitor 100 is mounted on a printed circuit board with a solder, the first and second plating layers may increase adhesive strength therebetween.

For example, the first and second plating layers may include a nickel (Ni) plating layer formed on the first and second external electrodes 131 and 132, and a tin (Sn) plating layer formed on the nickel plating layer, but the invention is not limited thereto.

Figure 2:
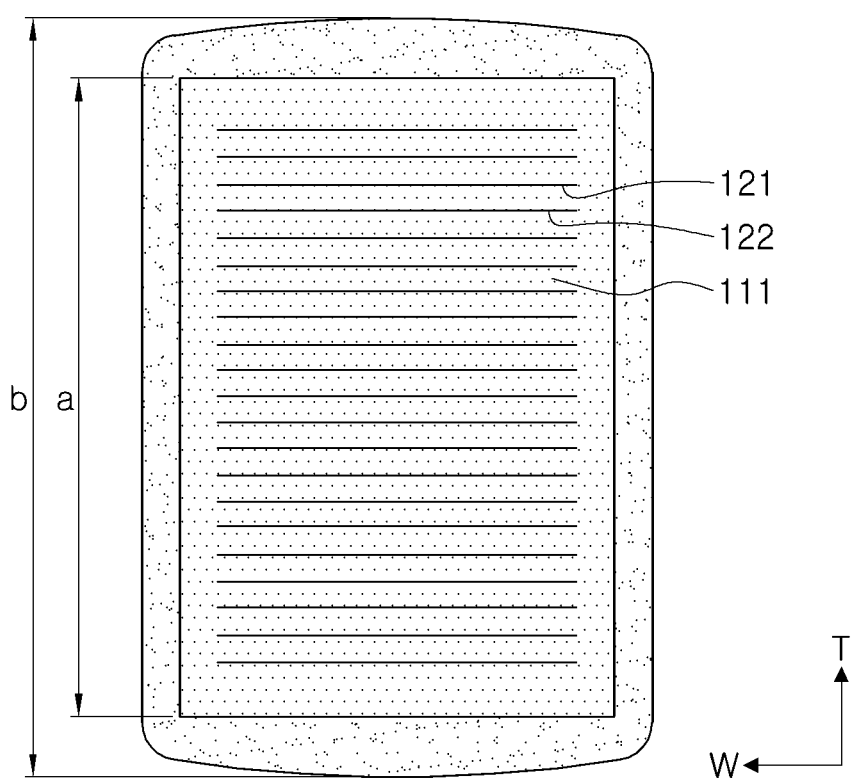
FIG. 2 is a cross-sectional view taken along line A-A' of FIG. 1.

FIG. 2 is a cross-sectional view taken along line A-A' of FIG. 1, and shows a cross-section of the multilayer ceramic capacitor in the thickness-width direction according to the embodiment of the invention.

Referring to FIG. 2, when a height of the ceramic body 110 is defined as a, and a distance from an upper end of the first or second external electrode 131 or 132 formed on the first main surface of the ceramic body 110 to a lower end of the first or second external electrode 131 or 132 formed on the second main surface of the ceramic body 110 is defined as b, 0.990≤a/b<1 may be satisfied.

Table 1 shows whether or not the multilayer ceramic capacitor 100 topples over at the time of being mounted on a printed circuit board, and whether or not reliability with respect to short-circuits and moisture resistance is secured, in accordance with a/b values, that is, a ratio of the height of the ceramic body 110 to an overall height of the multilayer ceramic capacitor 100 including the first or second external electrode 131 or 132.

TABLE 1

| Sample No. | a/b | Incidence of Multilayer Ceramic Capacitor Toppling Over | | Reliability |
|---|---|---|---|---|
| | | Frequency | Results | |
| 1 | 0.988 | 15/20 | NG | OK |
| 2 | 0.989 | 7/20 | NG | OK |
| 3 | 0.990 | 0/20 | OK | OK |
| 4 | 0.991 | 0/20 | OK | OK |
| 5 | 0.992 | 0/20 | OK | OK |
| 6 | 0.993 | 0/20 | OK | OK |
| 7 | 0.995 | 0/20 | OK | OK |
| 8 | 0.999 | 0/20 | OK | OK |

Referring to Table 1, in the case of Samples 1 and 2, in which the mounting surface, that is, the second main surface, of the ceramic body was excessively convex downwardly, it could be confirmed that when respective samples were mounted on the printed circuit board twenty times, they toppled over fifteen times and seven times, respectively.

Additionally, in the case of Samples 4 to 8, even in the case that the mounting surface, that is, the second main surface, of the ceramic body was downwardly convex, respective samples did not topple over when mounted on the printed circuit board twenty times. Therefore, it could be confirmed that a/b values were in a suitable range.

MODIFIED EXAMPLE

Figure 3:
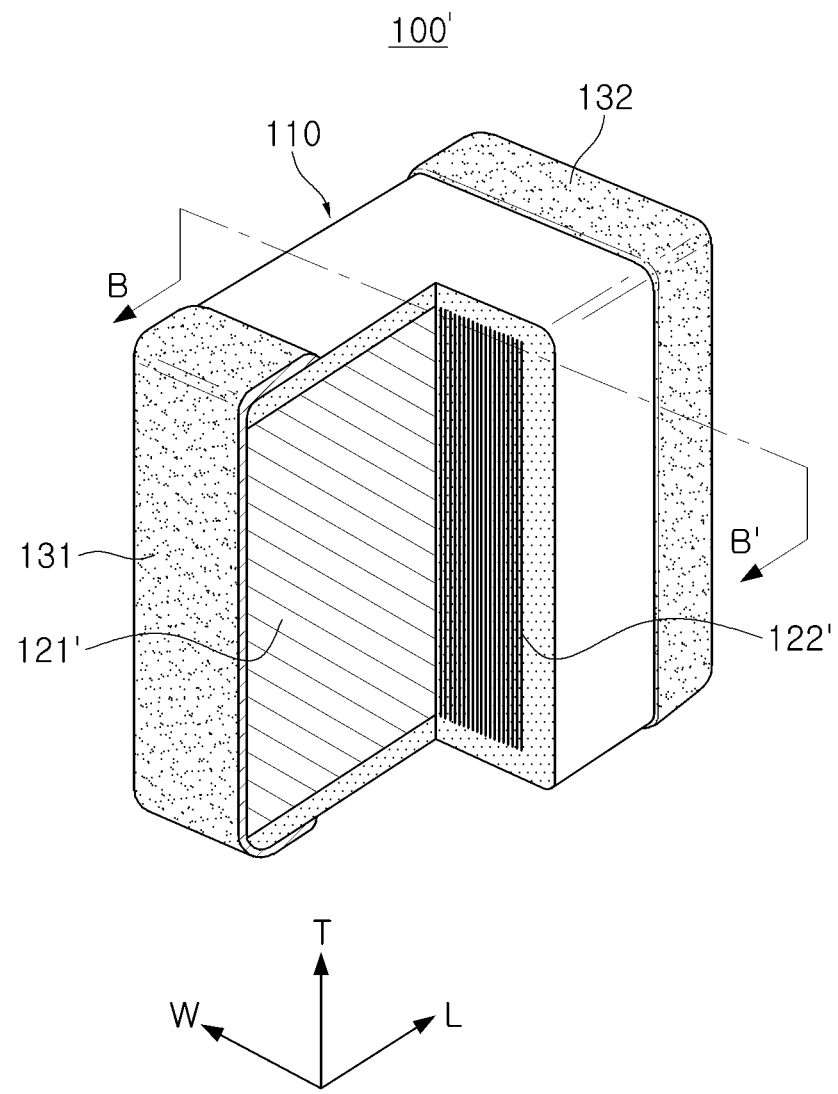
FIG. 3 is a partially cutaway perspective view of a multilayer ceramic capacitor according to another embodiment of the present invention.

FIG. 3 is a partially cutaway perspective view of a multilayer ceramic capacitor according to another embodiment of the present invention.

Here, since a structure in which the first and second external electrodes 131 and 132 are formed is the same as that of the previously described embodiment of the invention, a detailed description thereof will be omitted in order to avoid overlapped descriptions. First and second internal electrodes 121' and 122' having a different structure from the previously described embodiment of the invention will be described in detail.

Referring to FIG. 3, a multilayer ceramic capacitor 100' according to this embodiment of the invention includes a ceramic body 110 in which a plurality of the dielectric layers 111 are stacked in a width direction.

Therefore, first and second internal electrodes 121' and 122' are disposed to face each other in the width direction, having the ceramic sheet forming the dielectric layer interposed therebetween. The first and second internal electrodes 122' and 122' may be exposed through first and second end surfaces of the ceramic body 110 in the multilayer ceramic capacitor 100, respectively. Here, the first and second internal electrodes 121' and 122' may be electrically insulated from each other by the dielectric layer 111 interposed therebetween.

Figure 4:
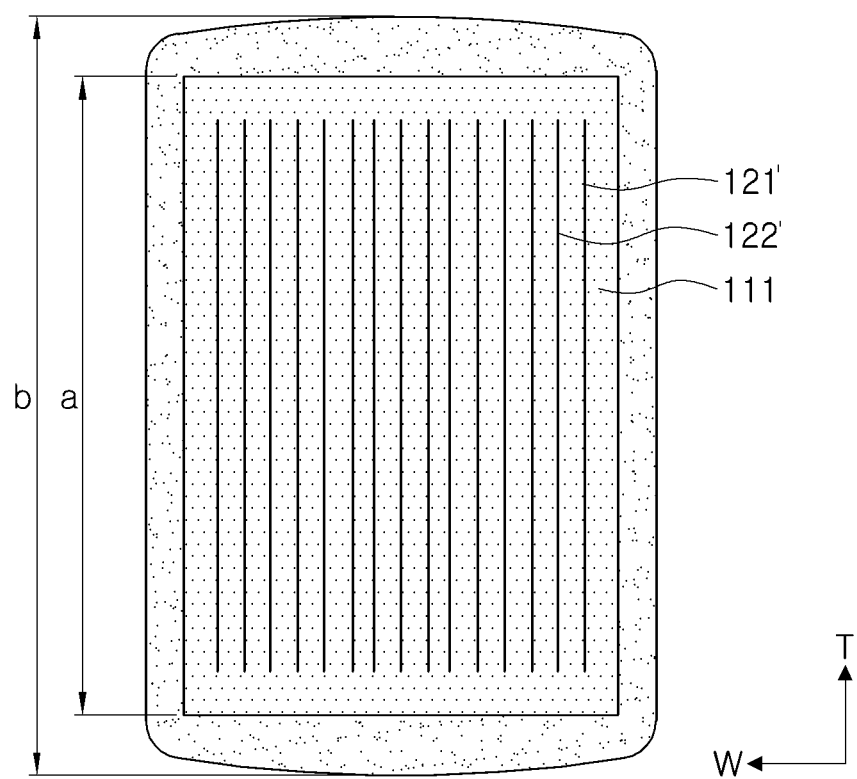
FIG. 4 is a cross-sectional view taken along line B-B' of FIG. 3.

FIG. 4 is a cross-sectional view taken along line B-B' of FIG. 3, and shows a cross-section of the multilayer ceramic capacitor in the thickness-width direction according to the embodiment of the invention.

Referring to FIG. 4, when a height of the ceramic body 110 is defined as a, and a distance from an upper end of the first or second external electrode 131 or 132 formed on the first main surface of the ceramic body 110 to a lower end of the first or second external electrode 131 or 132 formed on the second main surface of the ceramic body 110 is defined as b, $0.990 \leq a/b < 1$ may be satisfied.

Method of Manufacturing Multilayer Ceramic Capacitor

Hereinafter, a method of manufacturing a multilayer ceramic capacitor according to an embodiment of the present invention will be described.

First, a plurality of ceramic sheets may be prepared. The ceramic sheet, used to form the dielectric layer 111 of the ceramic body 110, may be produced by mixing a ceramic powder, a polymer, a solvent, and the like, to prepare ceramic slurry, and then applying the ceramic slurry to a carrier film using a doctor blade method or the like, and drying the ceramic slurry thereon, to be manufactured as a sheet having a thickness of several μm.

Next, the conductive paste may be printed on at least one surface of the ceramic sheet to a predetermined thickness to thereby form a plurality of internal electrode patterns having a predetermined interval therebetween in a length direction.

Examples of the conductive paste printing methods for forming the internal electrode patterns include a screen printing method, a gravure printing method and the like. The invention is not limited thereto.

Next, a multilayer body may be prepared by alternately stacking the plurality of ceramic sheets having the internal electrode patterns formed thereon in a thickness direction, and pressurizing them in a stacking direction.

Thereafter, the multilayer body may be cut to 0603-standard size (length×width) chips, each corresponding to a size of a single capacitor, in which a thickness/length of the chip is more than 1.0. The chip may be sintered at a high temperature of 1050 to 1200° C. and polished to thereby realize the ceramic body 110 having the first and second internal electrodes 121 and 122.

Then, the first and second external electrodes 131 and 132 may be formed on both end surfaces of the ceramic body 110 in a length direction thereof so as to be electrically connected to the exposed portions of the first and second internal electrodes 121 and 122.

In addition, if necessary, after forming of the first and second external electrodes 131 and 132, a plating process such as an electroplating process may be performed on surfaces of the first and second external electrodes 131 and 132 to form first and second plating layers (not shown).

Here, when a height of the ceramic body 110 is defined as a, and a distance from an upper end of the first or second external electrode 131 or 132 formed on the first main surface of the ceramic body 110 to a lower end of the first or second external electrode 131 or 132 formed on the second main surface of the ceramic body 110 is defined as b, $0.990 \leq a/b < 1$ may be satisfied.

Board for Mounting Multilayer Ceramic Capacitor

Figure 5:
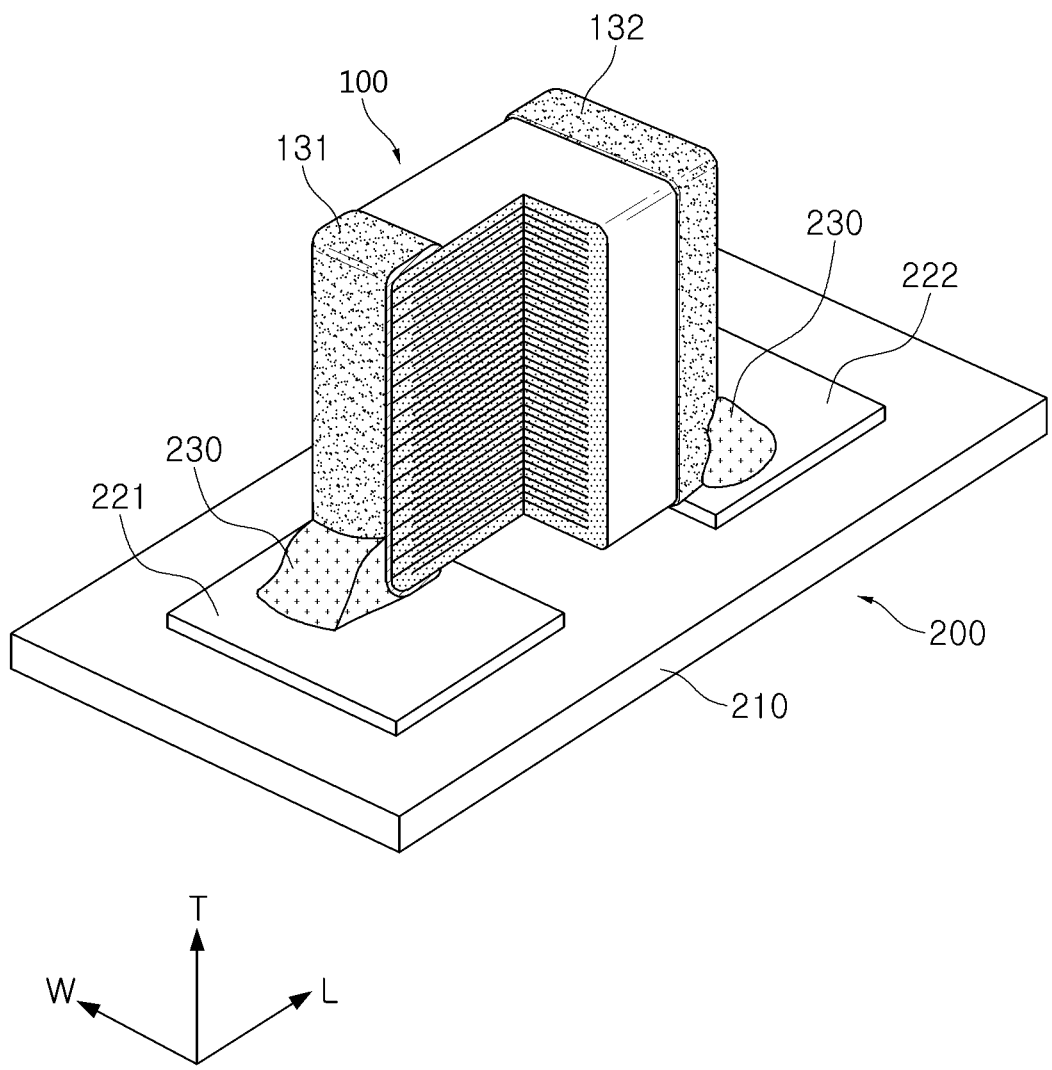
FIG. 5 is a partially cutaway perspective view of a multilayer ceramic capacitor mounted on a printed circuit board according to an embodiment of the present invention.

FIG. 5 is a partially cutaway perspective view of a multilayer ceramic capacitor mounted on a printed circuit board according to an embodiment of the present invention.

Referring to FIG. 5, a board 200 for mounting the multilayer ceramic capacitor 100 according to an embodiment of the present invention includes a printed circuit board 210 on which the multilayer ceramic capacitor 100 is mounted horizontally or vertically; and first and second electrode pads 221 and 222 formed on a surface of the printed circuit board 210 so as to be spaced apart from each other.

Here, the multilayer ceramic capacitor 100 may be electrically connected to the printed circuit board 210 by a solder 230 in a state in which portions of the first and second external electrodes 131 and 132 disposed on the second main surface are positioned to contact the first and second electrode pads 221 and 222, respectively.

As set forth above, according to embodiments of the present invention, a mounting failure of a multilayer ceramic electronic component is reduced by preventing the multilayer ceramic electronic component from toppling over when being mounted on a printed circuit board or the like, even in the case in which external electrodes formed on end surfaces of the multilayer ceramic electronic component have a rounded circumferential surface, due to a limitation on a predetermined range of a ratio of a height of a ceramic body to an overall height of the multilayer ceramic electronic component including the external electrodes, while realizing a high level of capacitance as the number of stacked layers increases. In addition, the multilayer ceramic electronic component may have an effect of preventing degradations in reliability by avoiding short-circuit defects and moisture resistance failures resulting from the infiltration of a plating solution by preventing internal cracks caused by step portions.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic electronic component comprising:
   a ceramic body including a plurality of dielectric layers stacked in a thickness direction and satisfying T/W>1.0 when a width thereof is defined as W and a thickness thereof is defined as T;
   a plurality of first and second internal electrodes disposed in the ceramic body so as to face each other, having the dielectric layer disposed therebetween, and alternately exposed through both end surfaces of the ceramic body; and
   first and second external electrodes extended from the end surfaces of the ceramic body to upper and lower main surfaces of the ceramic body, and electrically connected to the first and second internal electrodes, respectively,
   wherein, when a height of the ceramic body is defined as a, and a distance from an upper end of the first or second external electrode formed on the upper main surface of the ceramic body to a lower end of the first or second external electrode formed on the lower main surface of the ceramic body is defined as b, $0.990 \leq a/b < 1$ is satisfied.

2. The multilayer ceramic electronic component of claim 1, wherein when an average thickness of the dielectric layers is defined as td, 0.1 µm≤td≤0.6 µm is satisfied.

3. The multilayer ceramic electronic component of claim 1, wherein the first and second internal electrodes may have a thickness of 0.6 µm or less.

4. The multilayer ceramic electronic component of claim 1, wherein when an average thickness of the dielectric layers is defined as td and an average thickness of the first and second internal electrodes is defined as te, te/td≤0.833 is satisfied.

5. The multilayer ceramic electronic component of claim 1, wherein the dielectric layers are stacked in an amount of 500 or more layers.

6. A board for mounting a multilayer ceramic electronic component, the board comprising:
   a printed circuit board having first and second electrode pads provided thereon; and
   the multilayer ceramic electronic component of claim 1 disposed on the first and second electrode pads.

7. A multilayer ceramic electronic component, comprising:
   a ceramic body including a plurality of dielectric layers stacked in a width direction and satisfying T/W>1.0 when a width thereof is defined as W and a thickness thereof is defined as T;
   a plurality of first and second internal electrodes disposed in the ceramic body so as to face each other, having the dielectric layer disposed therebetween, and alternately exposed through both end surfaces of the ceramic body; and
   first and second external electrodes extended from the end surfaces of the ceramic body to upper and lower main surfaces of the ceramic body, and electrically connected to the first and second internal electrodes, respectively,
   wherein, when a height of the ceramic body is defined as a, and a distance from an upper end of the first or second external electrode formed on the upper main surface of the ceramic body to a lower end of the first or second external electrode formed on the lower main surface of the ceramic body is defined as b, 0.990≤a/b<1 is satisfied.

8. The multilayer ceramic electronic component of claim 7, wherein when an average thickness of the dielectric layers is defined as td, 0.1 µm≤td≤0.6 µm is satisfied.

9. The multilayer ceramic electronic component of claim 7, wherein the first and second internal electrodes may have a thickness of 0.6 µm or less.

10. The multilayer ceramic electronic component of claim 7, wherein when an average thickness of the dielectric layers is defined as td, and an average thickness of the first and second internal electrodes is defined as te, te/td≤0.833 is satisfied.

11. The multilayer ceramic electronic component of claim 7, wherein the dielectric layers are stacked in an amount of 500 or more layers.

* * * * *